(12) United States Patent
Halder et al.

(10) Patent No.: US 8,183,933 B2
(45) Date of Patent: May 22, 2012

(54) HIGH-VOLTAGE IMPULSE AMPLIFIER

(75) Inventors: Subrata Halder, Piscataway, NJ (US);
Renfeng Jin, Bethlehem, PA (US);
James C.M. Hwang, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 80 days.

(21) Appl. No.: 12/922,491

(22) PCT Filed: Apr. 3, 2009

(86) PCT No.: PCT/US2009/039483
§ 371 (c)(1),
(2), (4) Date: Sep. 14, 2010

(87) PCT Pub. No.: WO2009/146133
PCT Pub. Date: Dec. 3, 2009

(65) Prior Publication Data
US 2011/0006847 A1    Jan. 13, 2011

Related U.S. Application Data

(60) Provisional application No. 61/041,950, filed on Apr. 3, 2008.

(51) Int. Cl.
*H03F 3/04* (2006.01)
*H03F 1/24* (2006.01)

(52) U.S. Cl. .......................................... 330/311; 330/96

(58) Field of Classification Search .................. 330/310, 330/311, 297, 296, 285
See application file for complete search history.

(56) References Cited

U.S. PATENT DOCUMENTS

| 6,198,347 | B1 * | 3/2001 | Sander et al. ................. 330/251 |
| 7,142,058 | B2 | 11/2006 | Bokatius |
| 2005/0122172 | A1 | 6/2005 | Glass et al. |

OTHER PUBLICATIONS

International Preliminary Report on Patentability issued Oct. 14, 2010 in counterpart PCT application.

* cited by examiner

*Primary Examiner* — Robert Pascal
*Assistant Examiner* — Khiem Nguyen
(74) *Attorney, Agent, or Firm* — Duane Morris LLP

(57) ABSTRACT

A circuit includes a first transistor in a common-collector configuration and a heterojunction bipolar transistor (HBT) in a common-emitter configuration. The first transistor has a base coupled to an input node for receiving a pulsed signal. A collector of the first transistor is coupled to a first voltage source node. A base of the HBT is coupled to an emitter of the first transistor. A collector of the HBT is coupled to a second voltage source node configured to bias the HBT normally off. The HBT operating isothermally when the pulsed signal has a short-pulse width and a low duty cycle. The first transistor drives the HBT when the pulsed signal is received at the base of the first transistor to output an amplified pulsed signal at the collector of the HBT.

26 Claims, 11 Drawing Sheets

HIGH-VOLTAGE IMPULSE AMPLIFIER

CROSS-REFERENCE TO RELATED APPLICATIONS

This application is a national stage application under 35 U.S.C. §371 of International Patent Application No. PCT/US2009/039483, filed Apr. 3, 2009, which claims priority to U.S. Provisional Application No. 61/041,950, filed Apr. 3, 2008, which are incorporated by reference herein in their entireties.

FIELD OF DISCLOSURE

The disclosed system and method relate to amplifiers. More specifically, the disclosed system and method relate to high-voltage impulse amplifiers using bipolar transistors (BJTs).

BACKGROUND

Sub-nanosecond pulse generators are common components of carrier-less ultra-wideband (UWB) transmitters. These sub-nanosecond pulse generator are especially implemented in low-duty-cycle high-peak-power transmitters used in high-resolution ranging applications, for example. Most conventional pulse generators are now based on complementary metal-oxide semiconductor (CMOS) or BiCMOS integrated circuit (IC) technologies as MOSFETs enable high speed switching.

However, these pulse-generator ICs usually cannot generate a voltage that is sufficiently high to drive highly resistive UWB antennas and to compensate for losses due to connectors, filters, or the like as the supply voltages for these pulse generators are typically around 1 V. Discrete step-recovery diodes (SRDs) have been implemented in an attempt to increase the voltage of the pulse-generator ICs. While SRDs provide an increase in voltage, such a hybrid solution is bulky, costly, and inefficient.

Accordingly, high-voltage impulse amplifiers are desirable.

SUMMARY

In some embodiments, a circuit includes a first transistor in a common-collector configuration and a heterojunction bipolar transistor (HBT) in a common-emitter configuration. The first transistor has a base coupled to an input node for receiving a pulsed signal. A collector of the first transistor is coupled to a first voltage source node for biasing the first transistor normally on. A base of the HBT is coupled to an emitter of the first transistor. A collector of the HBT is coupled to a second voltage source node for biasing the HBT normally off. The HBT operating isothermally when the pulsed signal has a short pulse width and a low duty cycle. The first transistor drives the HBT when the pulsed signal is received at the base of the first transistor to output an amplified pulsed signal at the collector of the HBT. The above and other features of the present disclosure will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention as well as other information pertinent to the disclosure.

DETAILED DESCRIPTION

Bipolar junction transistors (BJTs) provide relatively fast switching times for low-voltage applications. For higher voltage applications, the switching speed of BJTs decreases. Heterojunction bipolar transistors (HBTs) offer fast switching times and high breakdown voltages at radio and microwave frequencies making them useful for high-power applications. However, for normal operating conditions such as continuous-wave Class-A or Class-AB operating conditions, the generated power is lower than expected due to avalanche breakdown and Kirk effect, which limits the output voltage and current of the HBT.

The inventors have discovered that Class-C biasing of an HBT so that it is normally off to maintain isothermal operation when receiving an input pulse having a short pulse width and a low-duty cycle greatly improves the breakdown voltage and Kirk current limit of the HBT. Isothermal operation with output power much higher than that under typical continuous-wave operation may be achieved for pulsed signals having a pulse width that is shorter than the thermal time constant of the HBT. In some embodiments, the ratio of the thermal time constant of the HBT to the pulse width of a pulsed input signal is 10:1, e.g., the thermal time constant of the HBT is ten times greater than the pulse width of the input pulse. However, it is understood that the ratio of the thermal time constant of the HBT to the pulse width of the pulsed input signal may be greater than or less than 10:1, e.g., the thermal time constant of the HBT may be greater than or less than ten times the pulse width of the input pulsed signal.

This discovery advantageously enables amplifiers capable of high-voltage amplification of sub-nanosecond low-duty-cycle pulses to be developed on a single cost-effective compact IC chip that consumes little power. These amplifiers may be connected to CMOS or BiCMOS pulse generators to provide a sub-nanosecond pulse generator having a smaller size and that is cheaper to manufacture than conventional hybrid pulse-generator ICs implemented with discrete SRDs.

Figure 1A:
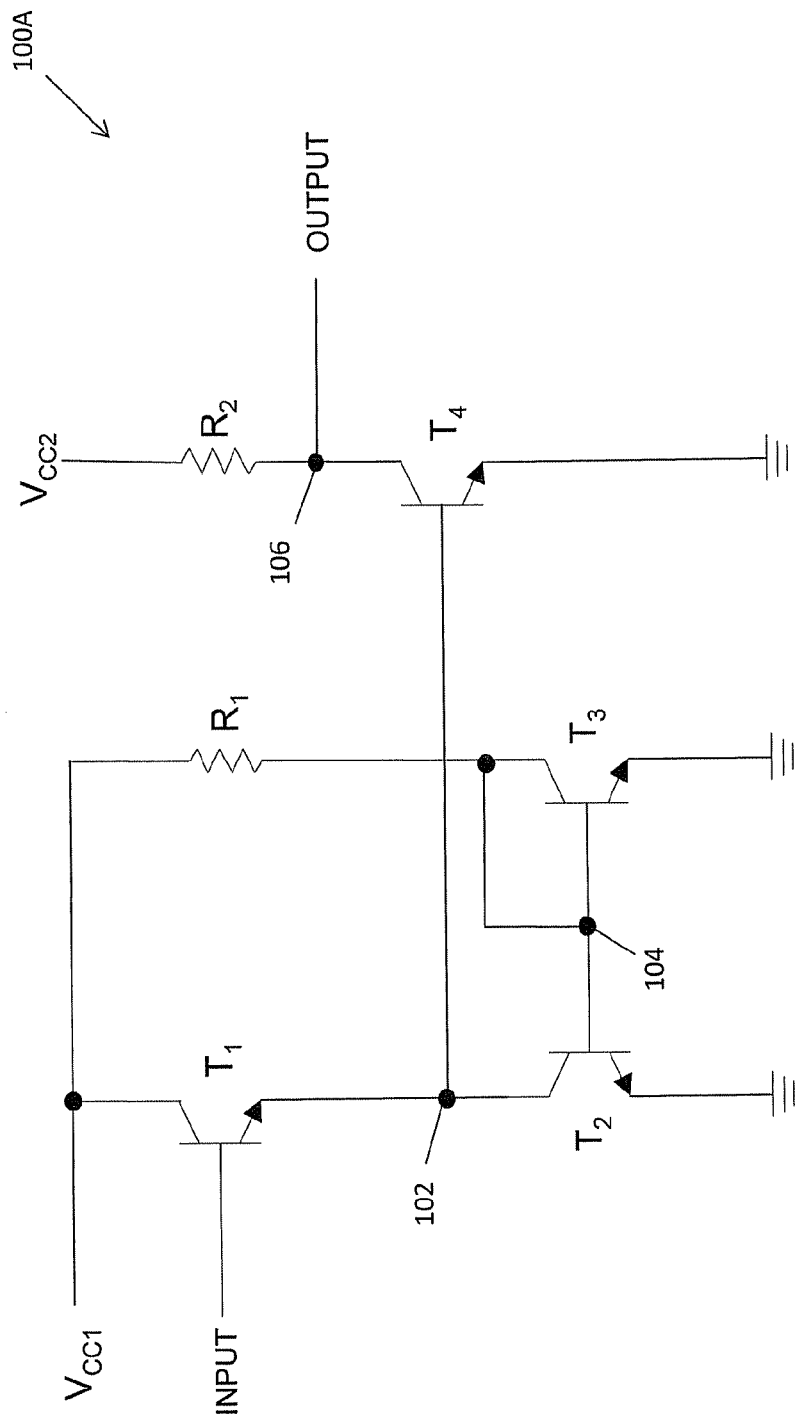
FIGS. 1A-1E are schematic diagrams of single-stage high-voltage impulse amplifiers.

FIG. 1A illustrates one example of a single-stage amplifier 100A including a Darlington pair with a transistor $T_1$ in common-collector configuration driving a transistor $T_4$ in common-emitter configuration and a current-mirror pair with the current through transistor $T_2$ mirroring the current through transistor $T_3$. As shown in FIG. 1A, transistor $T_1$ has its collector connected to a first voltage source $V_{CC1}$ and its emitter connected to node 102, which is connected to the collector of transistor $T_2$ and to the base of transistor $T_4$. The base of transistor $T_1$ is configured to receive a pulsed input signal having a pulse width of less than one nanosecond, which may be generated by a CMOS or BiCMOS pulse generator, for example. The emitter of transistor $T_2$ is grounded, and the base of transistor $T_2$ is connected to the base of transistor $T_3$ at node 104. The collector of transistor $T_3$, which is shorted to its base, is connected to the first voltage source $V_{CC1}$ through a resistor $R_1$. Transistor $T_4$ has its emitter grounded and its collector connected to a second voltage source $V_{CC2}$ through a resistor $R_2$. Node 106, located between resistor $R_2$ and the collector of transistor $T_4$, may be used for the output of the single-stage amplifier 100A.

Each of the transistors $T_1$-$T_4$ may be a gallium arsenide (GaAs) HBT. One skilled in the art will understand that the HBTs may be formed from other materials including, but not limited to, silicon germanium (SiGe), indium phosphide (InP), gallium nitride (GaN), or the like. In some embodiments, only transistor $T_4$ is an HBT and the other transistors $T_1$-$T_3$ are BJTs. In some embodiment where transistors $T_1$-$T_4$ are all HBTs, transistors $T_1$-$T_3$ may have the same design or layout as each other and transistor $T_4$ may have a different design or layout. For example, each of transistors $T_1$, $T_2$, and $T_3$ may each be implemented having the same emitter area, and transistor $T_4$ may be implemented with an emitter area that is larger than the emitter areas of transistors $T_1$-$T_3$ to give the amplifier higher output capacity without consuming significantly more standby power.

Figure 1B:
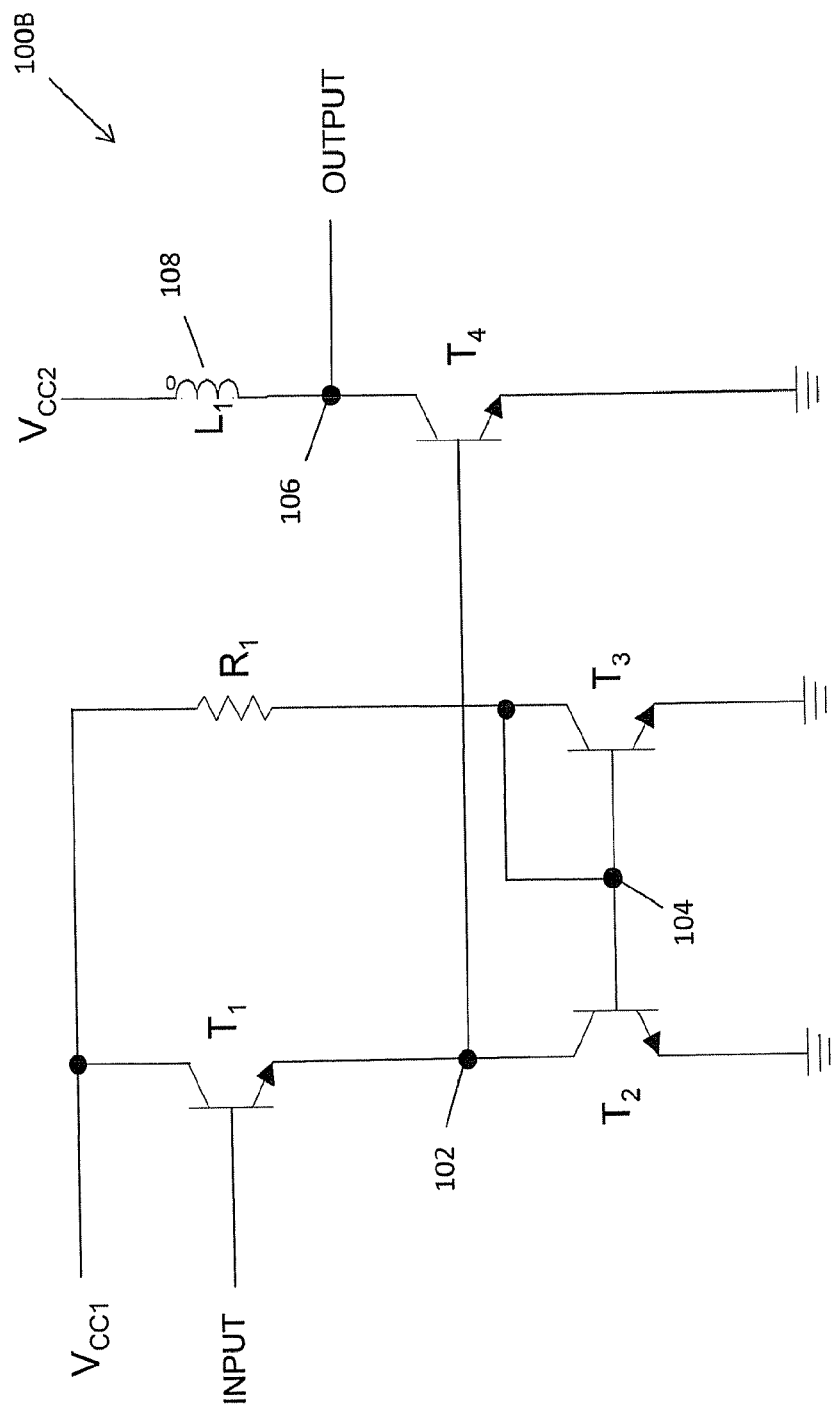
Figure 1C:
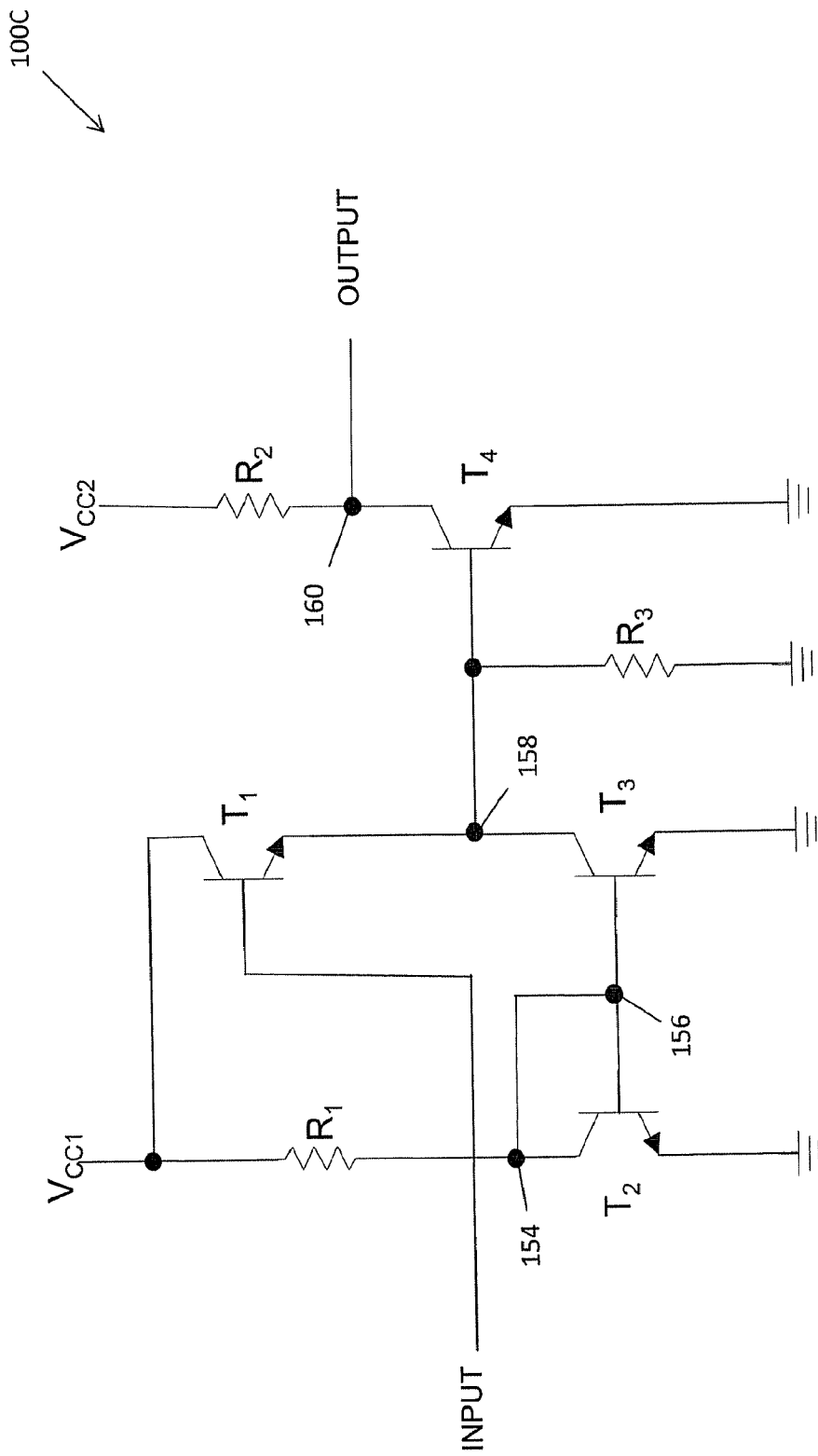

A high-voltage impulse amplifier having an output HBT being biased such that it is normally off may be implemented in a variety of configurations. FIG. 1B is a schematic diagram of another example of a single-stage amplifier 100B similar to the amplifier of FIG. 1A, but with resistor $R_2$ replaced by an inductor $L_1$ to increase the output voltage through inductive peaking at the expense of larger chip area as inductors tend to be larger than resistors. FIG. 1C is a schematic diagram of another example of a single-stage amplifier 100C. As shown in FIG. 1C, amplifier 100C is similar to the amplifier 100A, but includes a resistor $R_3$ shunting the base of transistor $T_4$ to ground. Shunting the base of transistor $T_4$ to ground brings it closer to the common-base configuration thereby further increasing its breakdown voltage at the expense of a lower gain.

Figure 1D:
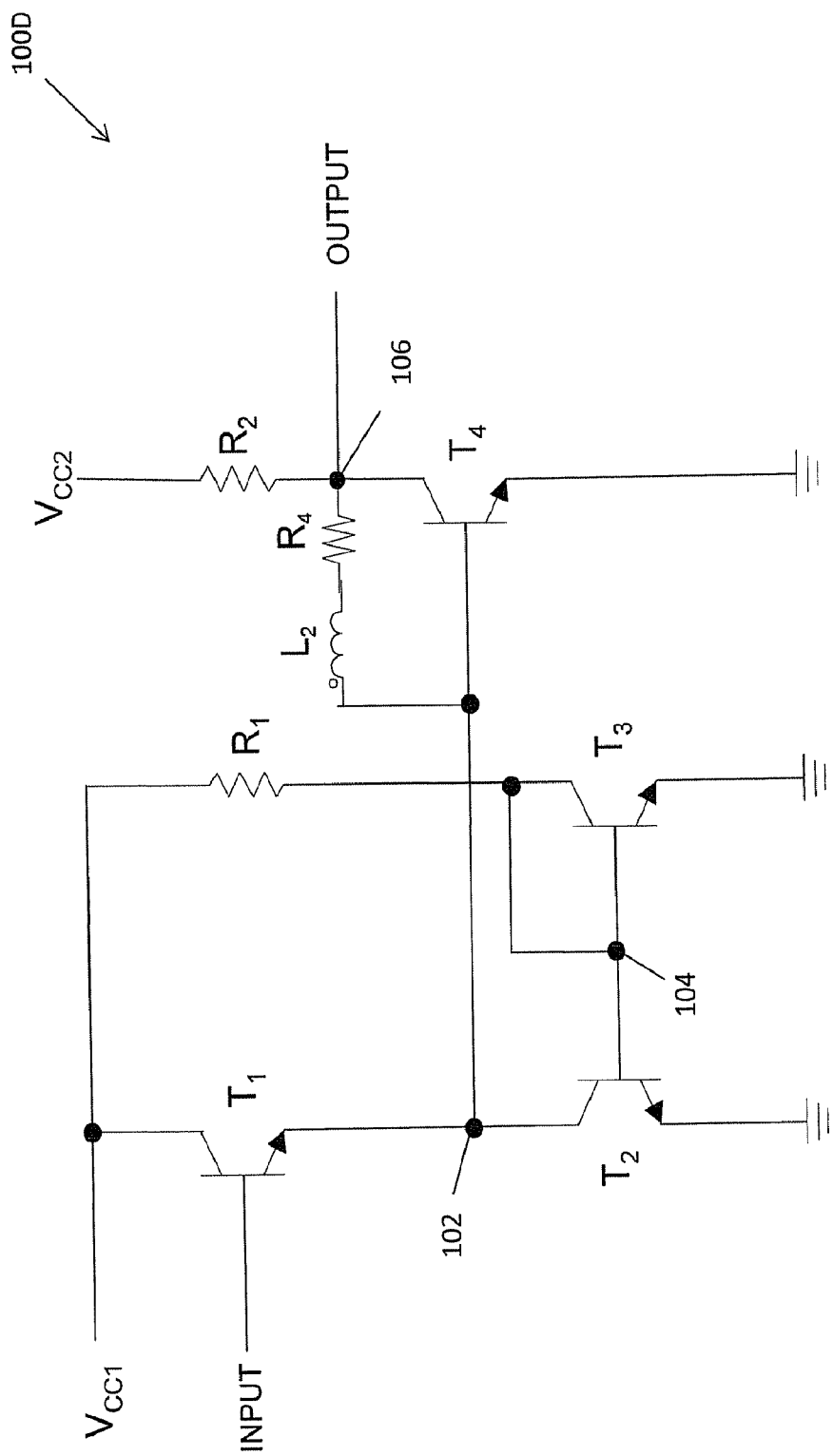
Figure 1E:
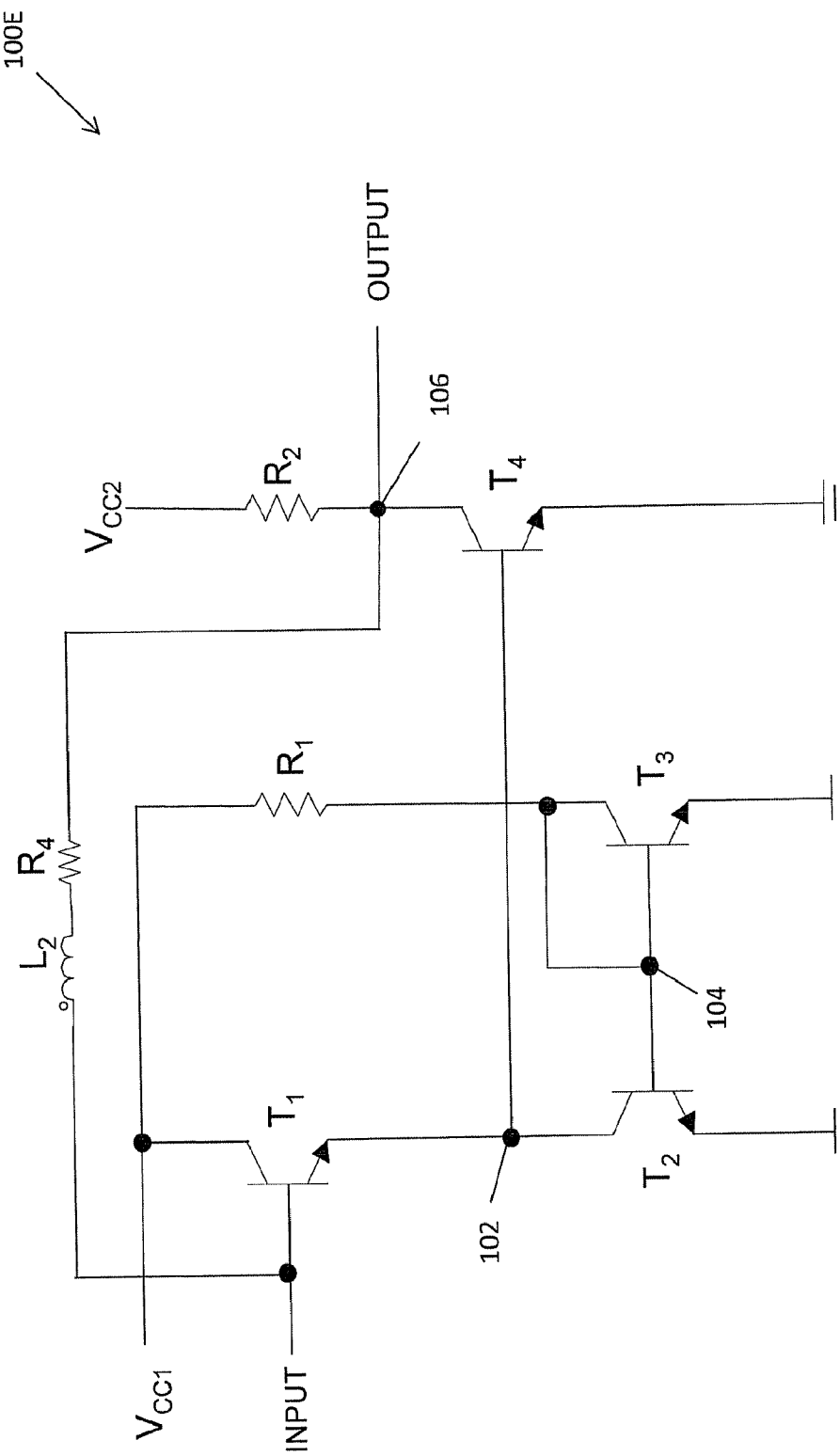

Low-pass feedback may be used to enhance the amplitude stability and control of the ultra-wideband impulse amplifier. FIG. 1D is a schematic diagram of another example of a single-stage impulse amplifier 100D. As shown in FIG. 1D, amplifier 100D is similar to the amplifier shown in FIG. 1A, but includes a series resistor $R_4$ and an inductor $L_2$ coupling the collector of transistor $T_4$ with its base. FIG. 1E is a schematic diagram of another example of a single-stage amplifier 100E. Amplifier 100E is similar to amplifier 100A, but includes a series resistor $R_4$ and an inductor $L_2$ coupling the collector of transistor $T_4$ with the base of transistor $T_1$.

Figure 2:
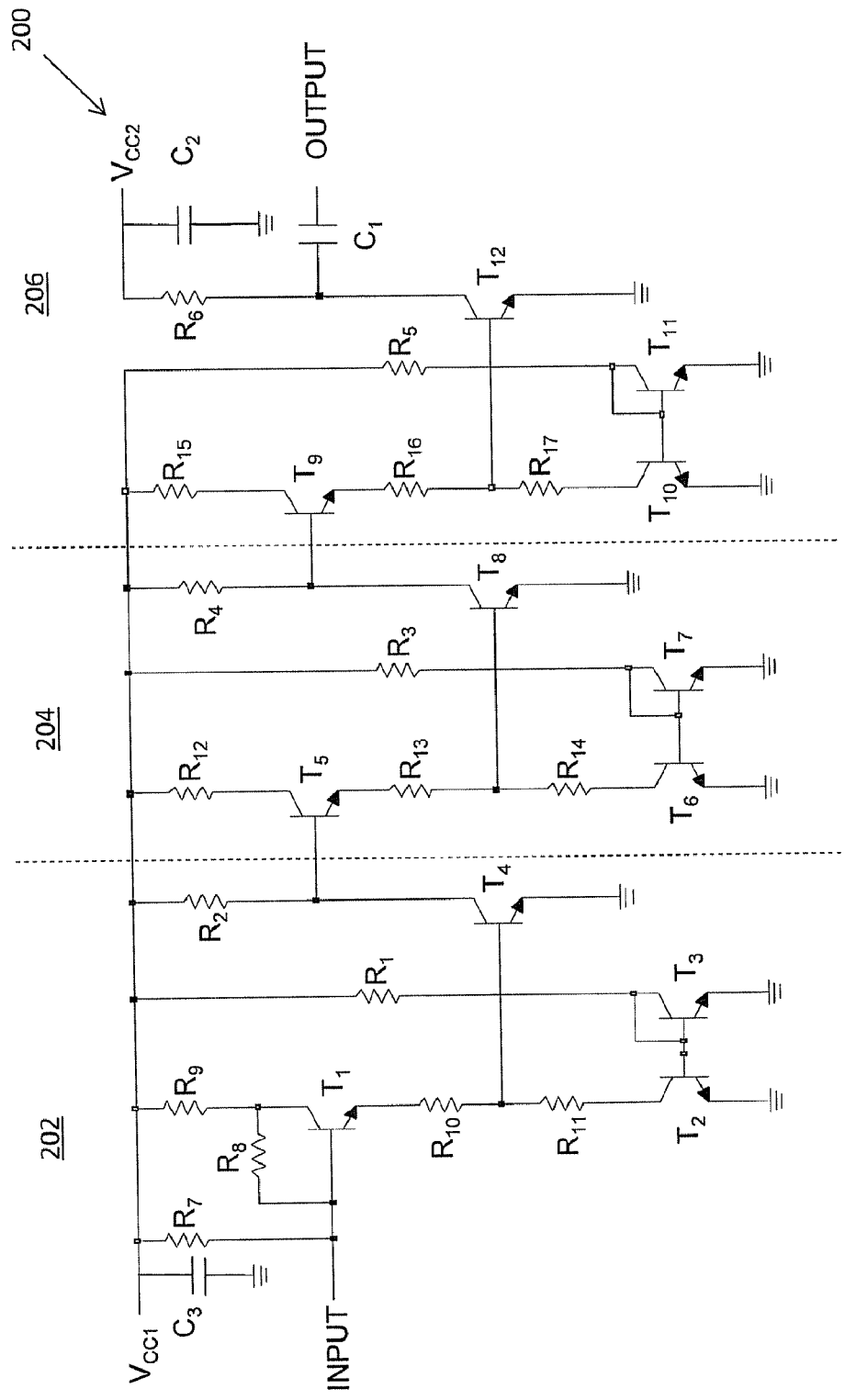
FIG. 2 is a schematic diagram of a three-stage high-voltage impulse amplifier.

Additional stages may be added to the single-stage amplifiers 100A-100E to provide additional amplification of the pulsed input signal. For example, an amplifier having two, three, four, or more stages may be implemented by cascading the single-stage amplifiers 100A-100E illustrated in FIGS. 1A-1E such that the output of one stage is used as the input for the next stage. FIG. 2 illustrates one example of a three-stage amplifier 200 comprising a cascade of three of the single-stage amplifiers. As shown in FIG. 2, transistors $T_1$-$T_{11}$ may all be biased such that they are normally on, and transistor $T_{12}$ may be biased such that it is normally off. A resistor $R_7$ is connected between the base of the transistor $T_1$ and the first voltage source $V_{CC1}$ to provide wideband input matching and proper biasing of $T_1$. Capacitor $C_1$ is connected to the collector of transistor $T_{12}$ to isolate the second voltage source $V_{CC2}$ from the output. Capacitors $C_2$ and $C_3$ may be provided to shunt $V_{CC1}$ and $V_{CC2}$, respectively, to ground to help isolate the voltage sources from the pulse signal. Resistor $R_8$ shunts the collector of transistor $T_1$ to its base for added stability.

The output of the third stage 206 is shunted to $V_{CC2}$ through resistor $R_6$. The resistance of $R_6$ may be selected to be larger than the resistance of the other resistors without consuming too much power since transistor $T_{12}$ is normally off. However, selecting a resistance that is too large may impact the pulse repetition frequency. When transistor $T_{12}$ is turned on by an input pulse, the output impedance of the third stage 206 quickly changes and may be designed to approach the impedance of the load connected to the output. The large-signal transient impedance may be adjusted by adjusting the size and bias of transistor $T_{12}$ to better suit the impedance of the load. One skilled in the art will understand that additional biasing elements, such as resistors $R_9$-$R_{17}$ illustrated in the amplifier 200 of FIG. 2, may be implemented to achieve the desired response of the amplifier as described below.

Figure 3:
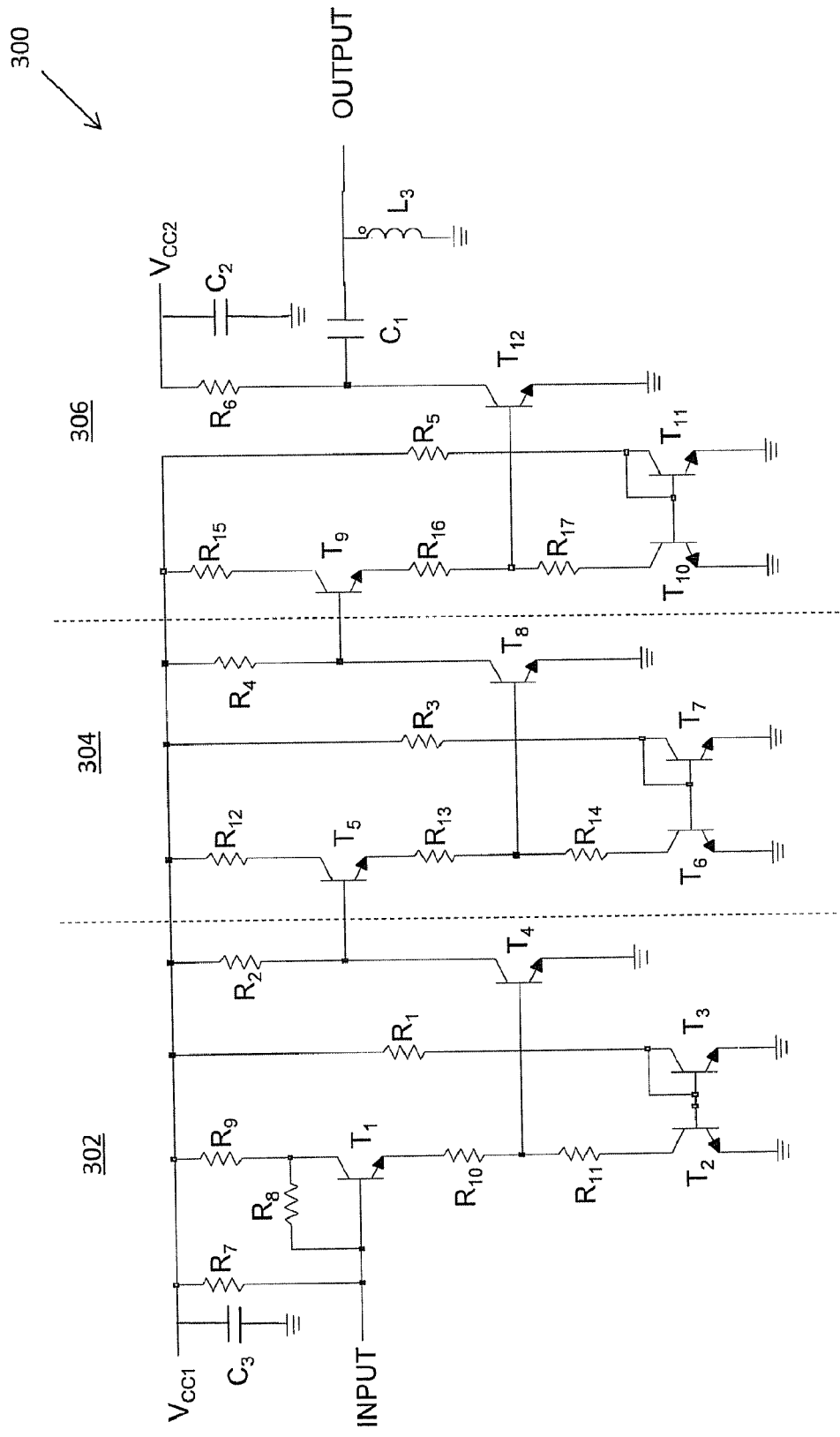
FIG. 3 is a schematic diagram of a first-order derivative circuit in series with a three-stage amplifier in accordance with the amplifier illustrated in FIG. 2.
Figure 4:
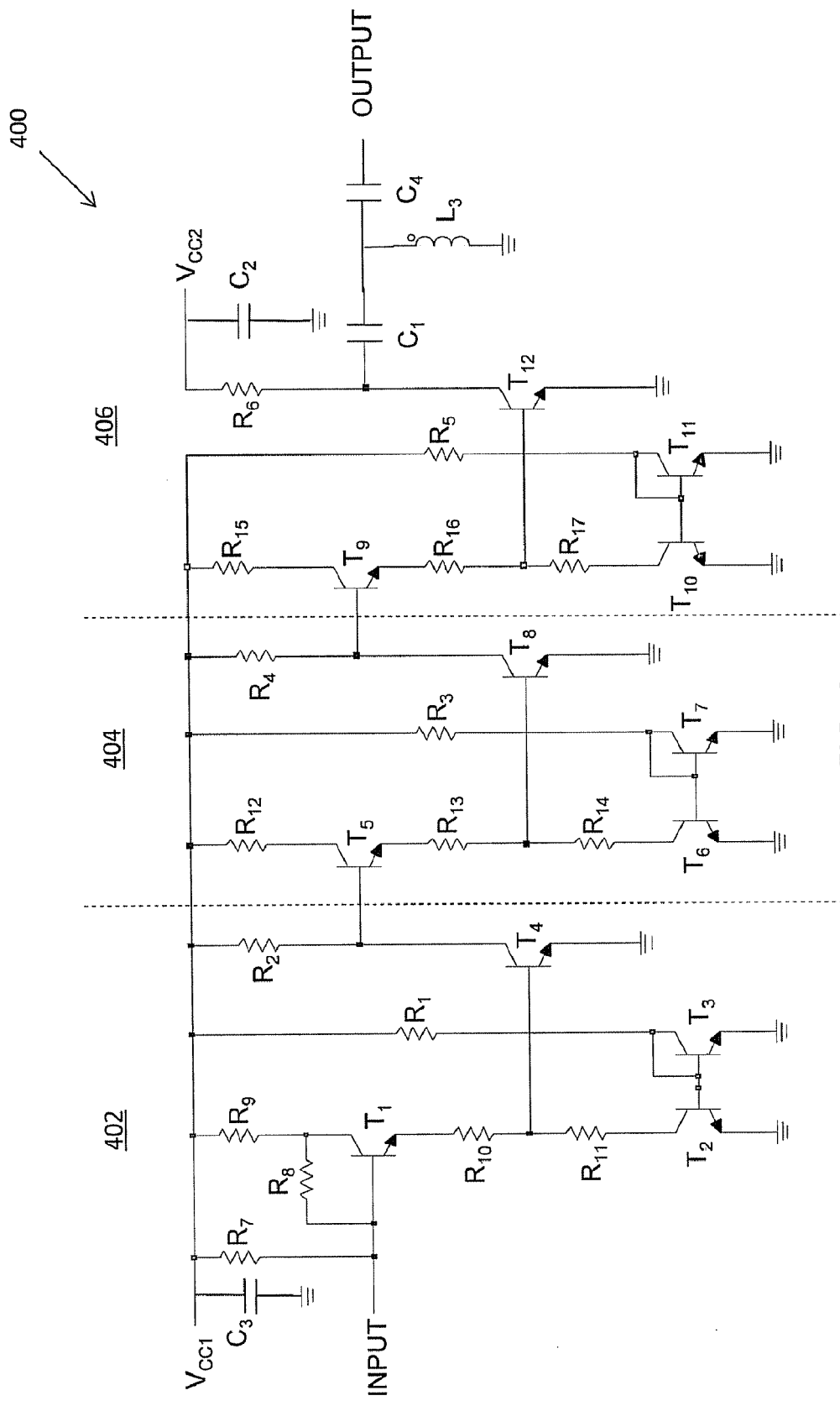
FIG. 4 is a schematic diagram of a second-order derivative circuit in series with a three-stage amplifier in accordance with the amplifier illustrated in FIG. 2.

Additionally, the output of the three-stage amplifier 200 illustrated in FIG. 2 may be connected to a filter or a matching circuit network to generate higher order derivative of the impulse signal to increase its high-frequency components while reducing its low-frequency components. FIG. 3 is a schematic diagram of a first-order derivative circuit in series with a three-stage amplifier in accordance with the amplifier 200 illustrated in FIG. 2. As shown in FIG. 3, an inductor $L_3$ may be used to connect the output to ground. FIG. 4 is a schematic diagram of a second-order derivative circuit in series with a three-stage amplifier in accordance with the amplifier illustrated in FIG. 2. As shown in FIG. 4, capacitor $C_4$ may be added between the output and the inductor $L_3$. It is understood that higher-order derivative circuits may be added.

As described above with respect to FIG. 2, each of the transistors $T_1$-$T_{11}$ may be a BJT or HBT each having the same design. Transistor $T_{12}$ shown in FIGS. 2-4 preferably is an HBT. Regardless of the number of stages, the final or output transistor of the amplifier preferably is an HBT biased such that it is normally off for isothermal operation. Since this transistor is normally off in the absence of an input signal, it may be of a larger size with larger output current capacity without consuming significant standby power.

With reference to FIG. 2, the operation of the three-stage amplifier 200 is now described. Each of the transistors of the amplifier 200 are biased in the active region to maximize linear gain except for transistor $T_{12}$ of the third stage 206, which is biased so that it is normally off to ensure isothermal operation and to minimize power consumption. Biasing the transistor $T_{12}$ normally off has the additional benefits of cutting off low-voltage ringing, preventing signal oscillation, and compressing pulse width. When transistor $T_1$ is on, its collector current is controlled by the current mirror formed by transistors $T_2$ and $T_3$. Transistor $T_1$ drives the output transistor $T_4$ of the first stage 202 to generate an output signal at node 208.

The output signal from the first stage 202 turns on transistor $T_5$ in the second stage 204. With transistor $T_5$ on, its current is controlled by the current mirror formed by transistors $T_6$ and $T_7$. Transistor $T_5$ drives the output transistor $T_3$ of the second stage 204, which outputs a further amplified pulsed signal to node 210. This further amplified signal at node 210 is used as the input for the third stage 206.

Transistor $T_{12}$ of the third stage 206 is normally biased at a sufficiently low voltage so that it is off in the absence of an input pulse. When transistor $T_9$ is on, $T_{10}$ shunts the base of transistor $T_{12}$ to ground allowing transistor $T_{12}$ to shift from common-emitter operation to common-base operation. The shunting of the base of transistor $T_{12}$ increases the breakdown voltage of transistor $T_{12}$.

EXAMPLES

A three-stage amplifier circuit as described above with respect to FIG. 2 was designed, fabricated, and tested. The three-stage sub-nanosecond pulse amplifier was constructed using GaAs HBTs for each of the transistors $T_1$-$T_{12}$. The emitter areas for each of the transistors $T_1$-$T_{11}$ were approximately 2 μm×20 μm, and the emitter area of transistor $T_{12}$ was approximately four times that of transistors $T_1$-$T_{11}$. The values of each of the resistors and capacitors is set forth below in Table 1.

TABLE 1

| $C_1 = 9$ pF | $C_2 = 9$ pF | $C_3 = 45$ pF | $R_1 = 300$ Ω | $R_2 = 300$ Ω |
|---|---|---|---|---|
| $R_3 = 210$ Ω | $R_4 = 220$ Ω | $R_5 = 250$ Ω | $R_6 = 1$ kΩ | $R_7 = 50$ Ω |
| $R_8 = 250$ Ω | $R_9 = 50$ Ω | $R_{10} = 150$ Ω | $R_{11} = 10$ Ω | $R_{12} = 10$ Ω |
| $R_{13} = 50$ Ω | $R_{14} = 10$ Ω | $R_{15} = 5$ Ω | $R_{16} = 5$ Ω | $R_{17} = 50$ Ω |

The voltage source $V_{CC1}$ was set to 3.3 V with respect to ground, and the voltage source $V_{CC2}$ was set to 14.5 V with respect to ground. The base of transistor $T_{12}$ was biased at approximately 1.1 V, which is below the approximately 1.3 V turn-on voltage of a GaAs HBT so that it was not on without an input pulse being received at the base of transistor $T_1$.

The three stages were directly coupled without any inductor to provide broadband matching and minimum die size. The die was approximately 1 mm×1 mm and included all of the HBTs, bias resistors, capacitors, and DC/RF probe pads. The die could have been compacted by at least a factor of 2, but was laid out to match the footprint of other circuits.

Figure 5B:
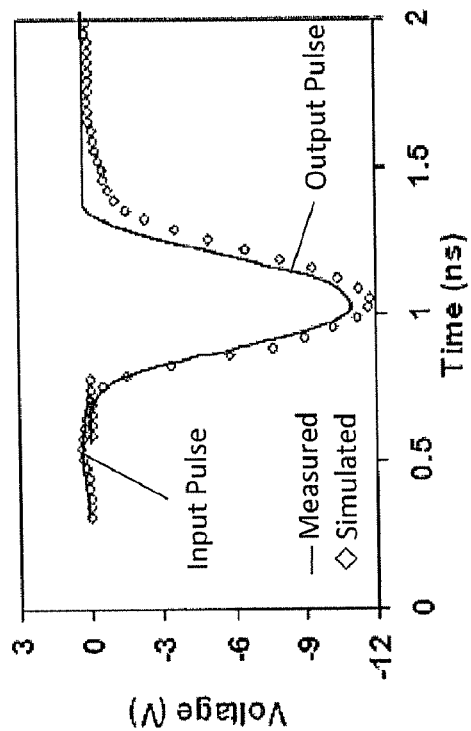
FIGS. 5A and 5B are voltage versus time graphs showing the output waveforms for input pulses having various input pulse amplitudes and widths for a three-stage amplifier in accordance with the amplifier illustrated in FIG. 2.
Figure 5A:
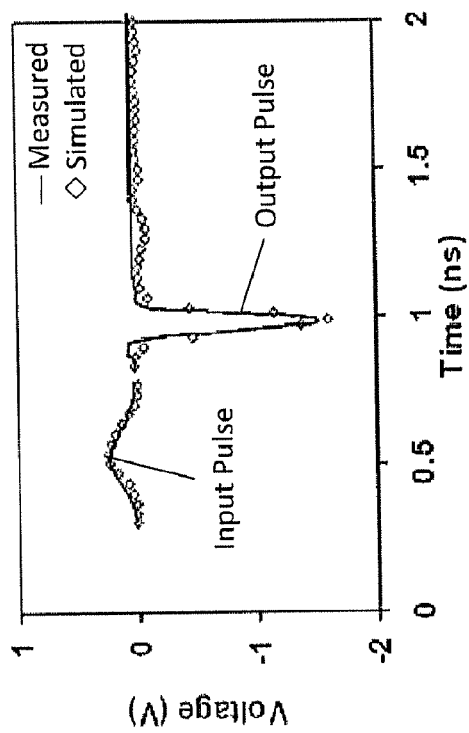

FIGS. 5A and 5B illustrate an input waveform and an output waveform on the same voltage versus time graph for the simulations and the actual measurements of an amplifier constructed in accordance with FIG. 2. The input signal in FIG. 5A had a pulse amplitude/pulse width of 0.25 V/0.15 ns, and the input signal in FIG. 5B had a pulse amplitude/pulse width of 0.36 V/0.2 ns. As shown in FIGS. 5A and 5B, the measured output pulse amplitude increases from 1.6 V to 11.8 V, while the output pulse width increases from 0.07 ns to 0.39 ns.

Figure 6A:
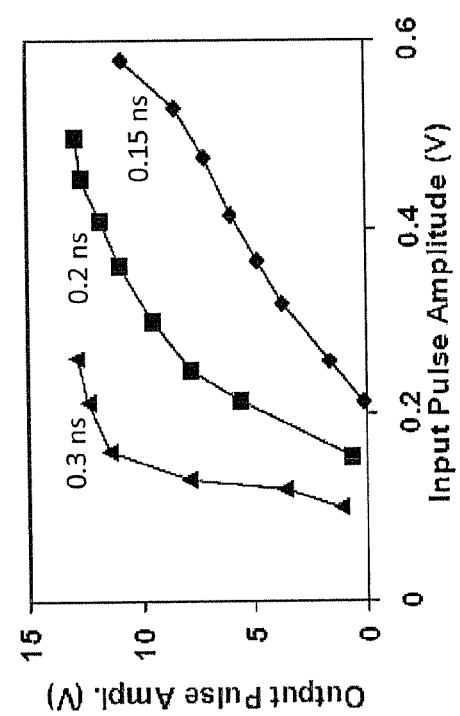
FIG. 6A is a graph of output pulse amplitude versus input pulse amplitude for input pulses having various input pulse widths for a three-stage amplifier in accordance with the amplifier illustrated in FIG. 2.
Figure 6B:
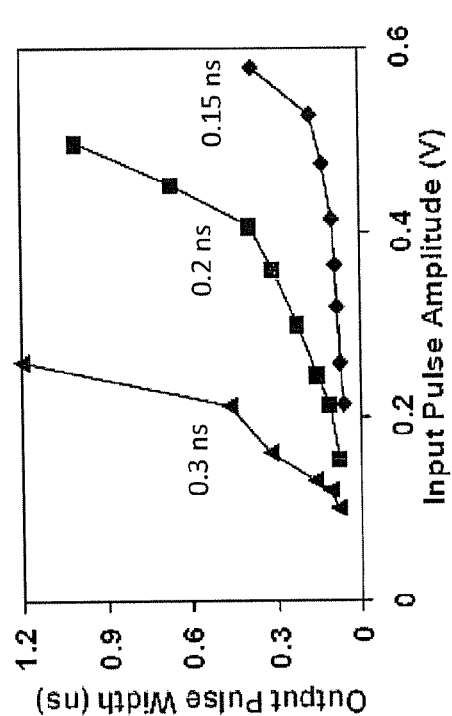
FIG. 6B is a graph of output pulse width versus input pulse amplitude for input pulses having various input pulse widths for a three-stage amplifier in accordance with the amplifier illustrated in FIG. 2.

FIG. 6A is a graph of output amplitude versus input pulse amplitude for input pulses having pulse widths of 0.15 ns, 0.2 ns, and 0.3 ns. FIG. 6B is a graph of output pulse width versus input pulse amplitude for input pulses having pulse widths of 0.15 ns, 0.2 ns, and 0.3 ns. As shown in FIG. 6A, for an input pulse width of 0.15 ns, the output is cutoff at an input amplitude of approximately 0.2 V because the transistor $T_{12}$ is biased 0.2 V below turn-on. Accordingly, the gain in FIG. 5A is very low since the input amplitude is barely above the cutoff. Above cutoff, the output amplitude increases almost linearly with the input amplitude up to approximately 10 V and is eventually clamped at 12.8 V, which is the difference between $V_{CC2}$ and the turn-on voltage of the transistors $T_{12}$ after accounting for some additional resistive losses. FIG. 6B shows that the width of the output pulse expands as the output amplitude is clamped.

Figure 7A:
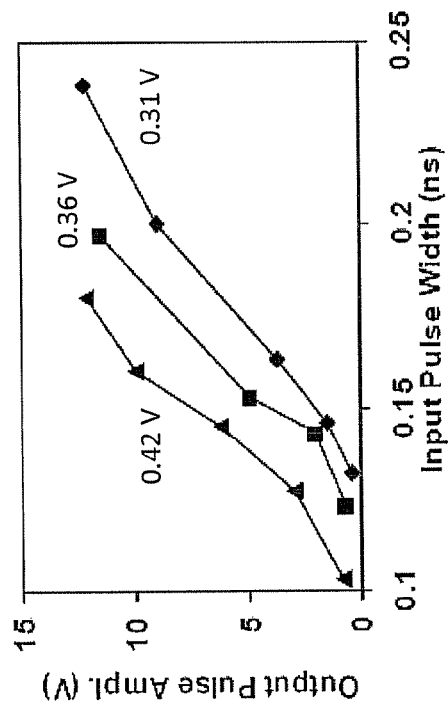
FIG. 7A is a graph of output pulse amplitude versus input pulse width for input pulses having various input pulse amplitudes for a three-stage amplifier in accordance with the amplifier illustrated in FIG. 2.
Figure 7B:
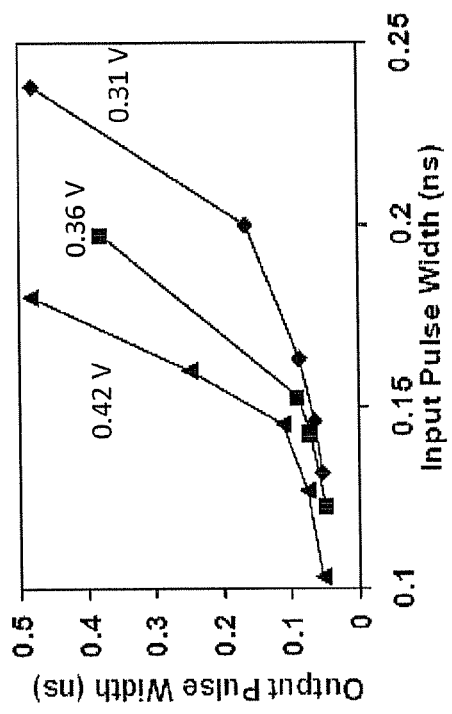
FIG. 7B is a graph of output pulse width versus input pulse width for input pulses having various input pulse amplitudes for a three-stage amplifier in accordance with the amplifier illustrated in FIG. 2.

The pulse compression/expansion characteristics are also illustrated in FIGS. 7A and 7B. As shown in FIG. 7A, the output amplitude increases linearly with the input width up to approximately 10 V and is compressed above 10 V. When the output amplitude exceeds 10 V, the output width becomes nonlinear with input width as shown in FIG. 7B. FIG. 7B also shows that the output width is compressed under small input amplitudes as the normally off transistor $T_{12}$ cuts off all but the peak of the input signal.

Figure 8:
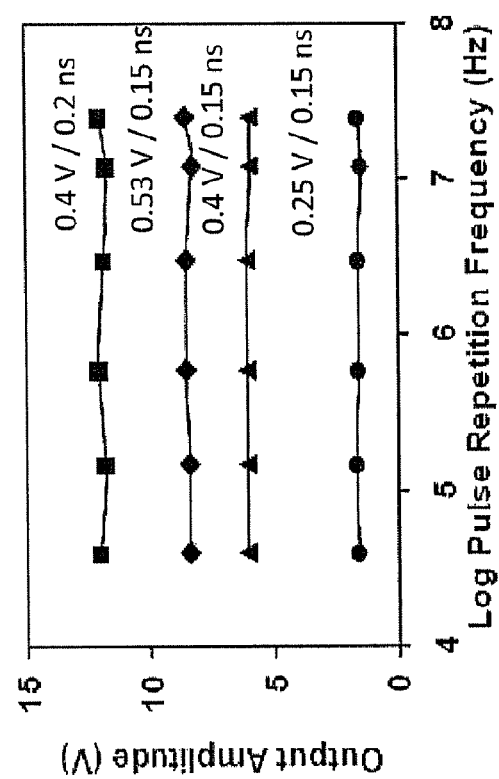
FIG. 8 is a graph of output amplitude versus log pulse repetition frequency for input pulses having various pulse amplitudes and widths for a three-stage amplifier in accordance with the amplifier illustrated in FIG. 2.

FIG. 8 illustrates that the measured output amplitude is insensitive to pulse repetition frequency between 40 kHz and 25 MHz. The measured output amplitude is also relatively insensitive to changes in supply voltage and ambient temperature.

The pulse amplifier constructed and tested consumed less than 120 mW with 90 mW of power being consumed through $V_{CC1}$. The amount of power consumed by the amplifier may be reduced by reducing the size of some of the transistors. For example, reducing the size of transistors $T_3$, $T_7$, and $T_{11}$ from 40 μm² to 8 μm² would save 40 percent of power. Additional power saving may be achieved by turning off all of the transistors when a pulse signal is not expected from the pulse generator. With an on-time of 1 ns and a pulse repetition frequency of 10 MHz, the power consumption can be reduced by a factor of 100 to approximately 1 mW.

Figure 9:
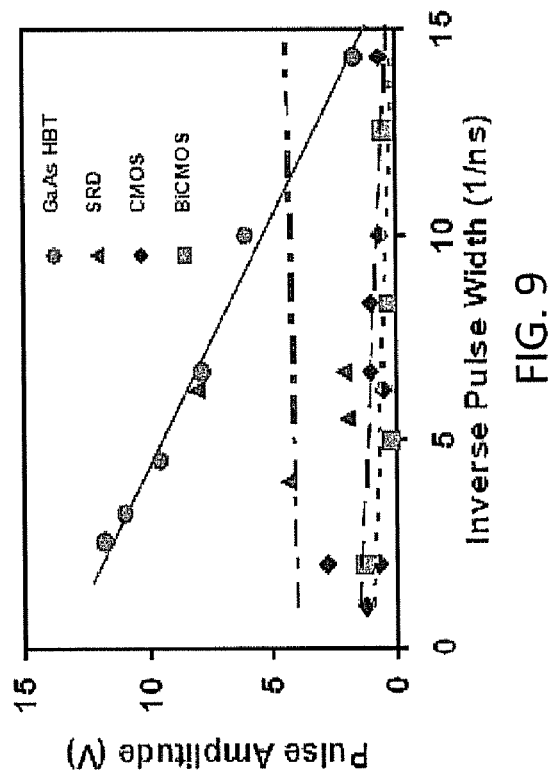
FIG. 9 is a graph of pulse amplitude versus inverse pulse width for different pulse generators and amplifiers of different technologies.

FIG. 9 is a graph of output pulse amplitude versus inverse pulse width for pulse generators and amplifiers using CMOS, BiCMOS, and SRD technologies compared to the tested amplifier fabricated using GaAs HBTs. As shown in FIG. 9, the amplifier implemented using GaAs HBTs has better voltage-speed product than each of the other technologies. Additionally, the amplifier constructed from GaAs HBTs is more compact and efficient than SRD-based pulse amplifiers of comparable performance.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. An amplifier circuit, comprising:
   a first transistor in a common-collector configuration having a base and a collector, the base of the first transistor coupled to an input node for receiving a pulsed signal, the collector of the first transistor coupled to a first voltage source node; and
   a heterojunction bipolar transistor (HBT) in a common-emitter configuration having a base coupled to an emitter of the first transistor, a collector of the HBT coupled to a second voltage source node for biasing the HBT such that the HBT is normally off, the HBT operating isothermally when the pulsed signal has a short-pulse width and a low-duty-cycle,
   wherein the first transistor drives the HBT when the pulsed signal is received at the base of the first transistor to output an amplified pulsed signal at the collector of the HBT.

2. The amplifier circuit of claim 1, wherein the HBT is a gallium arsenide (GaAs) HBT.

3. The amplifier circuit of claim 1, further comprising a current mirror coupled to the first transistor for controlling the collector current of the first transistor.

4. The amplifier circuit of claim 3, wherein the current mirror includes:
 a second transistor having a collector coupled to an emitter of the first transistor; and
 a third transistor having a base coupled to a base of the second transistor and a collector of the third transistor.

5. The amplifier circuit of claim 1, wherein the first transistor is an HBT.

6. The amplifier circuit of claim 1, wherein the first transistor and the HBT form a Darlington pair.

7. The amplifier circuit of claim 1, further comprising a resistor coupled between the collector of the HBT and the second voltage source node for proper HBT biasing and broadband output matching.

8. The amplifier circuit of claim 1, wherein the first transistor is biased such that it is normally on.

9. The amplifier circuit of claim 1, wherein the collector of the HBT is coupled to the base of the HBT to provide feedback to the HBT.

10. The amplifier circuit of claim 1, further comprising an inductive circuit coupled between the second voltage source node and the collector of the HBT.

11. The amplifier circuit of claim 1, further comprising a resistor coupled between the base of the first transistor and the first voltage source node for proper transistor biasing and broadband input matching.

12. The amplifier circuit of claim 1, further comprising a pre-driver transistor coupled to the input node for amplifying an input pulsed signal and outputting the pulsed signal to the first transistor.

13. The amplifier circuit of claim 1, wherein the pulse width is shorter than a thermal time constant of the HBT.

14. An amplifier, comprising:
 an input stage, including:
  a first transistor in a common-collector configuration having a base and a collector, the base of the first common-collector transistor coupled to an input node for receiving a pulsed signal, the collector of the first common-collector transistor coupled to a first voltage source node,
  a first transistor in a common-emitter configuration having a base coupled to an emitter of the first common-collector transistor, the first common-emitter transistor having a collector coupled to an input stage output node for outputting an intermediate amplified pulsed signal; and
 an output stage for receiving and amplifying the intermediate amplified pulsed signal, the output stage including:
  a second transistor in the common-collector configuration having a base coupled to an input node for receiving the intermediate amplified pulsed signal, and
  a heterojunction bipolar transistor (HBT) in a common-emitter configuration having a base coupled to the input stage output node,
 wherein the HBT is biased such that it is normally off, the HBT operating isothermally when the pulsed signal has a short pulse width and a low duty cycle,
 wherein upon receiving the pulsed signal the input stage drives the output stage to output an amplified pulsed signal at the collector of the HBT.

15. The amplifier of claim 14, wherein the collector of the first common-collector transistor in the input stage is coupled to the base of the first common-collector transistor in the input stage to provide feedback to the first common-collector transistor in the input stage.

16. The amplifier of claim 14, wherein the collector of the HBT is coupled to a second voltage source.

17. The amplifier of claim 14, wherein the HBT is a gallium arsenide (GaAs) HBT.

18. The amplifier of claim 14, further comprising a resistor coupled to the collector of the HBT, the resistor having a resistance selected to maintain proper biasing of the HBT and to provide broadband output matching.

19. The amplifier of claim 14, further comprising one or more intermediate amplification stages coupled between the input stage and the output stage.

20. The amplifier of claim 14, wherein the pulse width is shorter than a thermal time constant of the HBT.

21. An amplifier, comprising:
 an input stage, including:
  a first transistor in a common-collector configuration having a base and a collector, the base of the first common-collector transistor coupled to an input node for receiving a pulsed signal, the collector of the first common-collector transistor coupled to a first voltage source node,
  a first transistor in a common-emitter configuration, the first common-emitter transistor having a base coupled to an emitter of the first common-collector transistor, the first common-emitter transistor having a collector coupled to an input stage output node for outputting a first amplified pulsed signal;
 at least one intermediate stage for receiving and amplifying the first amplified pulsed signal and providing an intermediate amplified pulsed signal; and
 an output stage for receiving an amplifying the second intermediate amplified pulsed signal, the output stage including:
  a second transistor in the common-collector configuration for receiving the first amplified pulsed signal, and
  a heterojunction bipolar junction transistor (HBT) in the common-emitter configuration having a base coupled to an emitter of the second common-collector transistor,
 wherein the HBT is biased such that it is normally off, the HBT operating isothermally when the pulsed signal has a short pulse width and a low duty cycle,
 wherein upon receiving the pulsed signal the input and intermediate stages drive the output stage to output an amplified pulsed signal at the collector of the HBT.

22. The amplifier of claim 21, wherein each of the stages includes a current mirror for controlling the collector currents of the common-collector transistors.

23. The amplifier of claim 21, further comprising a second intermediate amplification stage coupled between the input stage and the first intermediate stage.

24. The amplifier of claim 21, wherein each of the transistors except for the HBT transistor are biased such that they are normally on.

25. The amplifier of claim 21, wherein all of the transistors are biased off when the pulsed signal is not expected to be received.

26. The amplifier circuit of claim 21, wherein the pulse width is shorter than a thermal time constant of the HBT.

* * * * *